United States Patent [19]

Homma et al.

[11] Patent Number: 5,772,780
[45] Date of Patent: Jun. 30, 1998

[54] POLISHING AGENT AND POLISHING METHOD

[75] Inventors: Yoshio Homma, Hinode-machi; Kikuo Kusukawa, Fujino-machi; Shigeo Moriyama, Tama; Masayuki Nagasawa, Kawagoe, all of Japan

[73] Assignee: Hitachi, Ltd., Tokyo, Japan

[21] Appl. No.: 531,910

[22] Filed: Sep. 21, 1995

[30] Foreign Application Priority Data

Sep. 30, 1994 [JP] Japan ................................. 6-236445

[51] Int. Cl.$^6$ ........................................... B08B 7/00
[52] U.S. Cl. ................................ 134/7; 134/28; 134/29
[58] Field of Search ........................... 134/7, 6, 26, 28, 134/29; 437/225; 156/645.1; 51/309

[56] References Cited

U.S. PATENT DOCUMENTS

| | | | |
|---|---|---|---|
| 4,483,107 | 11/1984 | Tomoyori et al. | 451/51 |
| 4,671,851 | 6/1987 | Beyer et al. | 156/645.1 |
| 4,795,497 | 1/1989 | McConnell | 134/18 |
| 4,910,155 | 3/1990 | Cote et al. | 437/225 |
| 4,944,836 | 7/1990 | Beyer et al. | 156/645.1 |
| 4,954,142 | 9/1990 | Carr et al. | 51/309 |
| 5,036,015 | 7/1991 | Sandhu et al. | 437/225 |
| 5,084,071 | 1/1992 | Nenadic et al. | 51/309 |
| 5,139,571 | 8/1992 | Deal et al. | 106/3 |
| 5,245,790 | 9/1993 | Jerbic | 451/159 |
| 5,264,010 | 11/1993 | Brancaleoni et al. | 51/309 |
| 5,265,378 | 11/1993 | Rostoker | 451/9 |
| 5,382,272 | 1/1995 | Cook et al. | 51/309 |
| 5,403,228 | 4/1995 | Pasch | 451/259 |
| 5,439,569 | 8/1995 | Caprio | 204/153.1 |
| 5,445,996 | 8/1995 | Kodera et al. | 437/225 |

*Primary Examiner*—Jill Warden
*Assistant Examiner*—Alexander Markoff
*Attorney, Agent, or Firm*—Antonelli, Terry, Stout, & Kraus, LLP

[57] ABSTRACT

An organic insulating film is polished utilizing a polishing agent containing cerium oxide particles (a ceria slurry). The ceria slurry is composed of cerium oxide powder containing a total concentration of Na, Ca, Fe, and Cr of less than 10 ppm. Fragile inorganic and organic insulating films formed at relatively low temperatures can be polished without degrading characteristics of a semiconductor element having such films thereon, due to, e.g., Na diffusion.

22 Claims, 4 Drawing Sheets

POLISHING AGENT AND POLISHING METHOD

BACKGROUND OF THE INVENTION

The present invention relates to a polishing agent and a polishing method for polishing the surface of an insulating film or a coating insulating film constituting a semiconductor integrated circuit or an optical glass element.

When a semiconductor integrated circuit is manufactured with a wiring substrate of silicon, a variety of insulating films are used and their surfaces need to be machined into predetermined shapes. Polishing has been widely used as an effective technique for planarizing or smoothing the surfaces of the insulating films. Especially in the machining of a semiconductor integrated circuit, the chemical mechanical polishing (hereinafter referred to as the "CMP") has been examined for planarizing the surfaces. In Proceedings VLSI Multi level Interconnection Conference, pp. 20–26, 1991, for example, there is disclosed a method for polishing and planarizing an $SiO_2$ film using a polishing agent (hereinafter referred to as the "silica slurry") prepared by dispersing fine $SiO_2$ particles (colloidal silica or fumed silica) in an aqueous solution of potassium hydroxide (KOH). It is well known that the addition of the chemical reaction effect accelerates the polishing rate(hereinafter referred to as "removal rate") by keeping the liquid alkaline in a region where the pH value is higher than 7. However, the neutral region actually varies within a pH range of 6.5 to 7.5. Therefore, the solution is actually stable as an alkali in the pH region over 7.5 and as an acid in the pH region below 6.5).

When an insulating substance such as of a glass substrate other than a thin film used for manufacturing a lens and a liquid crystal display element, especially, a substance composed mainly of $SiO_2$ is polished, there is a known polishing agent (hereinafter referred to as the "ceria slurry") using cerium oxide powder. This ceria slurry is explained, for example, in Kikai no Kenkyu, volume 39, No. 12, pp. 1296–1300, 1987, Erekutoronikusuyo kessyozairyonoseimitukakogijutu. pp. 251–256, Saiensu Foramu Co., Tokyo, 1985. The actual polishing is effected by mixing cerium oxide powder in water. In the prior art polishing method using the ceria slurry, a mixture of the cerium oxide powder and water is merely used as the polishing agent. In short, the ceria slurry is not expected to exhibit a chemical effect using acidity or alkalinity but is used to bring about the so-called "mechanical polishing effect."

The ceria slurry can be applied to optical glass elements or the like but will degrade the characteristics of a semiconductor integrated circuit if applied to, the process of manufacturing a semiconductor integrated circuit. If the insulating film on a bipolar transistor, for example, is polished by the ceria slurry and is subjected to a heat treatment essential for the semiconductor manufacturing process, the current amplification factor $h_{fe}$ of the bipolar transistor markedly lowered. If, moreover, the insulating film on a diode is polished by using the ceria slurry, there arises a problem that the rectifying characteristics of the diode deteriorate.

SUMMARY OF THE INVENTION

An object of the present invention is to polish the insulating film of a semiconductor element or the like without degrading the characteristics of the semiconductor element.

The above-specified object is achieved by using a ceria slurry containing cerium oxide powder which contains impurities of less than 10 ppm of Na, Ca, Fe and Cr in total.

If the ceria slurry of the prior art is used for polishing, the characteristics of the semiconductor integrated circuit are degraded due to the low purity of the cerium oxide powder. The analysis of the ceria slurry of the prior art has revealed that the contents of impurities such as Na, Ca, Fe and Cr are from about 1 to about 20 ppm, their total exceeds 50 ppm, and the polishing agent contains many other metals. In short, these impurities adversely affect the current characteristics of the transistor. The impurity Na diffuses into the aforementioned bipolar transistor to lower the current amplification factor. When a coating film containing as little as 2 ppm of sodium (Na) is in contact with the surface of a semiconductor element such as a bipolar transistor, and the element is subjected to a heat treatment at 450° C. for about 30 minutes, the diffusion of Na seriously reduces the current amplification factor $h_{fe}$ of the bipolar transistor, as disclosed in Denshi Tokyo, IEEE Tokyo Section, pp. 70–73, 1981. The requirement of the impurity concentration is less than 10 ppm in accordance with the present invention. This value is larger than the threshold value of less than 2 ppm. If the concentration is less than 10 ppm, when cerium oxide powder is dispersed in water, the impurities in the cerium oxide particles dissolve little into water, so that any of the impurity concentrations in the dispersing liquid is less than 1 ppm and there arises no problem of Na diffusion or the like. Moreover, Ca is attached to and mixed with Na, that is, Ca is usually present anywhere Na is present. In order to reduce the Na concentration, it is essential to reduce the Ca content. Moreover, the presence of Fe and Cr degrades the rectifying characteristics or the like of the diode. With the increase in the leakage current, for example, the characteristics of a Schottky barrier diode will approach ohmic characteristics.

Unlike the aforementioned colloidal silica, the cerium oxide powder is generally extracted from an ore containing many impurities and then purified and pulverized, so that the characteristics vary according to the mine of the ore and the method of processing the particles.

The amount of Cr in cerium oxide powder is less than 10 ppm, therefore, the adverse effects can be prevented even if ceria slurry, used as the cerium by keeping the concentrations of Na, Ca, Fe and oxide powder, is used for machining semiconductor integrated circuits. In the course of repeating polishing, moreover, impurities may be accumulated in the polishing apparatus or container and may be a source of contamination. Hence, the concentration of the Na contaminant is desirably suppressed to no more than 2 ppm.

When the impurity concentration is less than 10 ppm, if the ceria slurry is prepared by dispersing the cerium oxide powder into water, the impurities in cerium oxide powder hardly dissolve into the liquid so that any impurity concentration in the liquid in which ceria is dispersed (is mixed into solvent to be used) is less than 1 ppm to cause no problem of Na diffusion or the like. Incidentally, if the contamination should be strictly avoided, it is necessary to suppress the concentration of each of the Na, Ca, Fe, Cr and K in the dispersion to no more than 0.1 ppm. When, moreover, the concentration of the cerium oxide powder in the dispersion is 5% or more, the dependency of the polishing rate upon the concentration is lowered to stabilize the polishing operation.

When, moreover, the prior art ceria slurry having a high impurity content was used for the polishing, many polishing scratches causing defective products were formed in the manufacture of wiring substrates for semiconductor integrated circuits and the like. There were visually detectable five to ten polishing scratches in the area of a diameter of about 4 inches. These scratches are thought to have been formed by a small number of large particles contained in the ceria slurry. It has also been found that the polishing scratches are liable to be formed especially in a low density and fragile film such as a CVD (Chemical Vapor Deposition) film formed by a chemical reaction at a low temperature less than 500° C. or organic and inorganic coating film. This is because the cerium oxide powder of the prior art has an average particle size exceeding 1 $\mu$m. It has been found that the polishing scratches are suppressed if the average particle size is less than 1 $\mu$m. The average particle diameter is preferably 0.3 $\mu$m or less especially for a fragile and soft organic insulating film. Here, cerium oxide particle size means a larger value obtained from either individual particle size or aggregated particle size. Average particle size expresses the average value of the measured particle size distribution. Since an organic insulating film generally has a low dielectric constant, a multi level wiring technique can be achieved to polish and planarize the insulating film so that the capacitance between the adjacent wirings can be reduced by several tens of percentage points. The degree of producing polishing scratches has a relation to not only the material to be polished but also generally the polishing depth. Thus, there is a tendency that more polishing scratches are formed as the polishing depth becomes larger. By using the ceria slurry of the present invention, however, scratches are small even though the polishing depth was greater, and, serious scratches causing defects are not observed. Further, using a polymer polishing pad on a polishing platen rather than a hard polishing platen is effective to suppress polishing scratches during polishing.

It has also been found for the cerium oxide that there are two kinds of cerium oxide powder having very different polishing characteristics. Specifically, one kind of cerium oxide powder is the one (ceria A) whose color quickly changes while foaming into dense yellow when it is mixed in an aqueous solution of hydrogen peroxide; and the other kind (ceria B) which hardly changes in color and slightly foams. These two kinds have substantially identical chemical compositions but vastly mutually different crystallite sizes of the particles. It can be considered from the results of an X-ray diffraction analysis that the former is an aggregate of fine particles having a small crystallite whereas the individual particles of the latter powder are substantially crystals. For example, the half value of the ceria A of the diffraction peak for the crystal orientations (111), (200) and (220) is no less than 0.5 whereas that of the ceria B is not more than 0.3. By half value, we mean the full width of the half maximum (FWHA). Moreover, the cerium oxide A has a crystallite size of not more than 30 nm for the above-specified crystal orientations whereas the cerium oxide B has a larger crystallite size of not less than 60 nm.

Cerium oxide A is suitable for selectively polishing an organic insulating film (which means, in this Specification, a film of a silicon compound containing 1% or more of organic components in the film. Concentration of organic components is expressed as the weight percentage of carbon and hydrogen in the films to the whole film weight.), and polishing an organic insulating film and a doped or nondoped insulating film at substantially equal rates. Selective CMP can be more stably carried out when the relative dielectric constant of the organic film is not larger than 3.5. Increasing the organic component to no less than 10% is effective for decreasing moisture absorption in the organic film. However, polishing polyimide film which is a very popular polymer as a highly reliable material using the cerium oxide A powder generates many polishing scratches, and could not provide good polished surface. In the Specification, a doped insulating film means an inorganic insulating film containing 0.1% or more of boron, phosphorus and other metallic impurities: a nondoped insulating film means an inorganic silicon compound insulating film containing silicon oxide as its main component but not any organic component, and containing 0.1% or less of boron or phosphorus. These organic insulating films and doped insulating films can be formed by coating. Cerium oxide B is suitable for polishing mainly doped and nondoped insulating films at a high rate.

For these uses, we have examined the method of controlling the exponent of hydrogen ion concentration pH value of the dispersion of the cerium oxide powder. The cerium oxide powder has been conventionally used in a substantially neutral liquid in the prior art. Here, the neutrality practically indicates that the hydrogen ion concentration is within a range of pH value about 6.5 to 7.5. Such a wide range of pH values( from 6.5 to 7.5) is due to the fact that the solution absorbs carbon dioxide and oxygen in the air when stored in the air and gradually changes slightly in an acidic direction (the pH value is 6.5 to 7), or the solution, when left in an atmosphere containing an alkaline gas, absorbs the gas and changes to the direction of a weak alkalinity (the pH value is 7 to 7.5).

According to the present invention, in contrast, the ceria particles are dispersed in water, and in addition the pH value is controlled. A surface active agent that does not contain Na may be added, if necessary, in addition to the acid and alkali. In order to keep the ceria slurry alkaline, it is necessary for the hydrogen ion concentration (ie, the pH value) to be stable over 7.5. It is desirable that the pH be over 8. A suitable material is an alkaline material, such as ammonia, water-holding hydrazine or amine containing neither Na nor K. In order to keep it acidic, on the other hand, the pH value may desirably be 6.5 or less by adding an acid of no or weak corrosiveness. An acid containing no metal as its component, such as oxalic acid, sulfuric acid, phosphoric acid, succinic acid or citric acid, is suitable. Hydrochloric acid, nitric acid or hydrogen peroxide may be added, if necessary. By using the aforementioned highly pure cerium oxide particles A and B having well-controlled average particle diameters and by keeping the dispersion acidic or alkaline, a high-speed, stable, selective polishing characteristic is imparted.

By controlling the pH value of the ceria slurry using the cerium oxide A to alkaline, the polishing rate of an organic insulating film could be increased to a much higher value than those of the inorganic insulating films regardless of whether they are doped or nondoped, as illustrated in FIG. 4(A). (Here, polishing a film selectively is defined as selective polishing. ) If, moreover, an acidic ceria slurry containing this cerium oxide A is used, the polishing rates of doped insulating films and nondoped insulating films can be substantially equalized to those of organic insulating films. In the case of the ceria slurry using the ceria B, on the other hand, the polishing rates of inorganic insulating films can be higher than those of the organic insulating film in a range from weak acidity to alkalinity, as shown in FIG. 4(B). Moreover, the polishing rates of the doped insulating films can also be higher than those of nondoped insulating films.

By using the ceria slurry of the present invention, when an organic insulating film is formed over a stepped wiring substrate having an inorganic insulating film formed on the surface and is polished by an alkaline ceria slurry containing cerium oxide A of the present invention, the surface can be flattened quickly and easily while leaving the organic insulating film in the recessed portion of the step without any substantial damage to the inorganic insulating film. The inorganic insulating film can be used as a so-called "polishing stopper layer."

Since, moreover, the polishing rates of inorganic insulating films and organic insulating films can be equalized, the roughness of the wiring substrate, on which they are present together, can be reduced by polishing without deteriorating the flatness. When, on the contrary, a doped insulating film formed over a nondoped insulating film having a rough surface is polished and this polishing must be ended when the nondoped insulating film is exposed, efficient operation can be achieved by using the ceria slurry containing the cerium oxide B having a pH value of 3 or more. The polishing effect is especially stable if the pH value lies on the alkaline side. By employing the ceria slurry containing the cerium oxide B, it is possible to use an organic insulating film as the polish stopper layer of the inorganic insulating film or to use a nondoped insulating film as the polish stopper layer of the doped insulating film. When, moreover, a two-layer insulating film is used having a doped or nondoped insulating film formed over an organic insulating film, it is preferable to use a ceria slurry which contains the cerium oxide B and which is not neutral, i.e., a ceria slurry whose pH value is not less than 3 and not more than 14.

There exists no prior art rinsing method effective for removing cerium oxide adhering after polishing. In the conventional manufacture of optical parts, there have been known only a physical wiping method using a soft cloth or a brush and a method of liberating cerium oxide particles by etching the surface to be polished with diluted hydrofluoric acid. By the former method, the surface of the wiring substrate having the aforementioned fragile and non-dense film is damaged. By the latter method, the insulating layer constituting the layer to be polished contains $SiO_2$ as its main component and is liable to be damaged by a diluted hydrofluoric acid, so that the application of the method has been limited. However, it has been found that the scratches can be prevented by dipping the wiring substrate, after being polished with the ceria slurry, in the non-diluted, diluted, or mixed solution of sulfuric acid, nitric acid, ammonium carbonate or ammonia. However, this process of removing the particles by those solutions is slow and the resulting concentration may not be low enough high. If necessary, therefore, the liquid temperature is elevated to 50° C. or higher, and hydrogen peroxide is added to the liquid, or the liquid is bubbled with ozone. The liquids thus treated are effective to react with the ceria particles themselves to dissolve them, so that the particle removing effect is less influenced by the material of the surface of the wiring substrate. Moreover, those treating liquids can be selectively used to avoid damaging the wiring substrate surface material. It is quite natural that the rinsing effect is enhanced by applying ultrasonic vibrations or by agitating the liquid while dipping the wiring substrate in the liquid.

DESCRIPTION OF EXAMPLES

[Example 1]

Figure 1A:
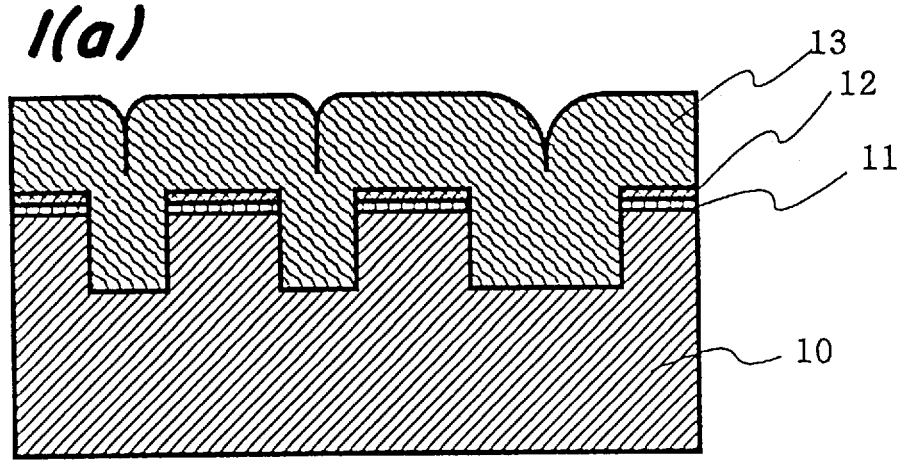
FIGS. 1(A) and 1(B) are views for explaining the process for planarizing the surface of an element isolating buried layer of a wiring substrate.
Figure 1B:
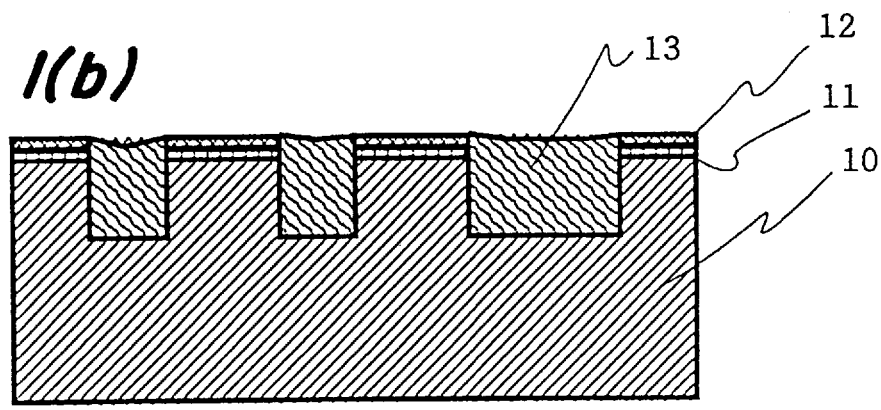

Example 1 of the present invention will be described with reference to FIGS. 1(A) and 1(B). Over the surface of a wiring substrate 10 of silicon, as shown in FIG. 1(A), there was provided a two-layer film which was composed of a first inorganic insulating film 11 of silicon oxide having a thickness of 10 nm and a silicon nitride film 12 having a thickness of 10 nm and which was machined into a predetermined shape. The wiring substrate 10 was etched, at its portions uncovered with the two-layer film to a depth of 0.5 $\mu$m. In these etched recesses, there was formed a buried layer 13 of silicon oxide having a thickness of 0.7 $\mu$m by a CVD method. Next, the buried layer 13 was polished with an alkaline ceria slurry (pH value is 10) using cerium oxide B, as shown in FIG. 1(B). The polishing load adopted was 0.15 $Kg/cm^2$, and the buried layer 13 was polished by the ceria slurry without changing the polishing cloths, or the like if the polishing load was within a range of 0.1 to 0.5 $Kg/cm^2$. This condition was adopted because the polishing rate drops but the planarity improves under such a low polishing load. The polishing platen and the slurry (although not shown) were kept at the room temperature. The relative velocity between the wiring substrate 10 and the polishing platen was about 30 m/min. Under these polishing conditions, the removal rate using a conventional silica slurry using colloidal silica was about 10 to 20 nm/min. at the highest, but the removal rate using the ceria slurry was as high as 50 to 150 nm/min. As the polishing operation progressed, the silicon nitride film 12 was exposed, and the polishing did not seem to progress. At this stage, the polishing was ended. In these ways, elements such as transistors were formed in those regions of the wiring substrate 10, which were isolated by the buried layer 13. Incidentally, the alkaline ceria slurry of the cerium oxide B was used in the example but may be replaced by an acid ceria slurry of the cerium oxide A. In the latter case, the removal rate more or less drops, but the removal rate is advantageously stable irrespective of the film quality of the buried layer 13. A highly selective polishing can be performed because the silicon nitride film 12 is hardly polished by the ceria slurry. After this polishing step, the wiring substrate 10 was dipped in a mixture of sulfuric acid and hydrogen peroxide. The cerium oxide particles were quickly etched out, so that the surface of the wiring substrate 10 was sufficiently planarized and cleaned.

[Example 2]

Figure 2A:
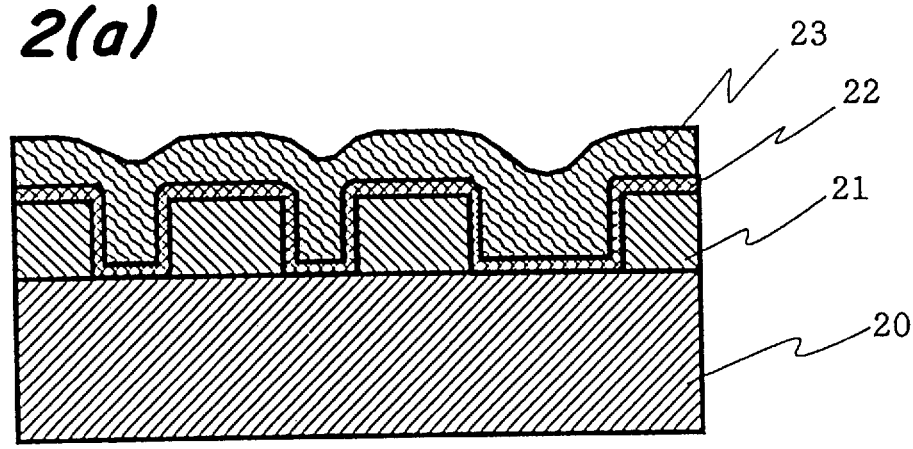
FIGS. 2(A) and 2(B) are views for explaining the process for planarizing an organic insulating film on the surface of a wiring substrate.
Figure 2B:
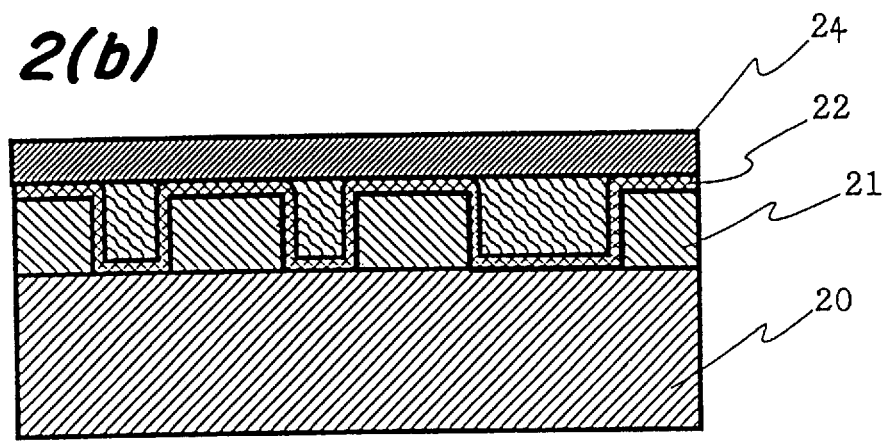

Example 2 of the present invention will be described with reference to FIGS. 2(A) and 2(B). First, FIG. 2(A) shows a wiring substrate 20 in which on the interconnection 21 of an aluminum alloy (hereinafter shortly referred to as "Al") having a thickness of about 1 $\mu$m a first insulating film 22 made of SiO2 having a thickness of 2 $\mu$m was formed by a PECVD (Plasma Enhanced Chemical Vapor Deposition method. Next, an organic insulating film 23 having a thickness of 1.2 $\mu$m was formed thereover by a coating method. This means that the coating was performed under the condition that the thickness of 1.2 $\mu$m would be achieved for a substrate having no roughness, but the thickness of the film applied on a rough surface of a substrate is naturally not even. The film thickness is the one which was measured after the film was dried after the coating and the solvent was almost completely removed, if not otherwise specified. Here, the organic insulating film 22 was made of HSG R7 (the trade name of a product by Hitachi Chemical Co., Ltd.).

After the coating, a heat treatment was carried out at the highest temperature of 450° C. Next, the applied organic insulating film 23 was polished by pressing the wiring substrate 20, while being rotated, and by dripping the (not-shown) ceria slurry which contained the cerium oxide A and whose pH value was kept at 10, onto the (not-shown) polishing plate on which was stuck a sheet of a polyurethane resin, fluoroplastic, or the like. The polishing condition was substantially identical to that of Example 1. The removal rate of the organic coating insulating film 23 at this time was about five times as high as that using a conventional slurry containing colloidal silica under the identical condition. Incidentally, the first insulating film 22 of a PECVD SiO2 film is hardly polished by the ceria slurry and therefore the margin for judging the end point of the polishing increases. Any material may be used for the organic insulating layer 23 as long as it contains 5% or more of organic component. The material for the inorganic insulating layer 22 may be a doped or nondoped inorganic insulating substance.

After the polishing, the wiring substrate was dipped in a mixture of nitric acid and hydrogen peroxide for 0.5 minutes or longer in order to etch the cerium oxide so that the ceria slurry was removed from the wiring substrate 20, and the substrate 20 was effectively cleaned. After this, the wiring substrate 20 was either neutralized by anammonia-based alkaline solution or cleaned to remove adhering matters other than the ceria slurry with an organic solvent, if necessary. Next, a second inorganic insulating film 24 of $SiO_2$ having athickness of 0.4 $\mu$m was formed by a PECVD method, if necessary.

Incidentally, the inorganic insulating film 22 does not have to be formed all over the Al interconnection but may be formed only on the faces of the Al wiring lines 21. As the polishing of the organic insulating film 23 progresses and the first insulating layer 22 is exposed, the polishing stops when the surface is flattened and the organic insulating film 22 is buried.

[Example 3]

Figure 3A:
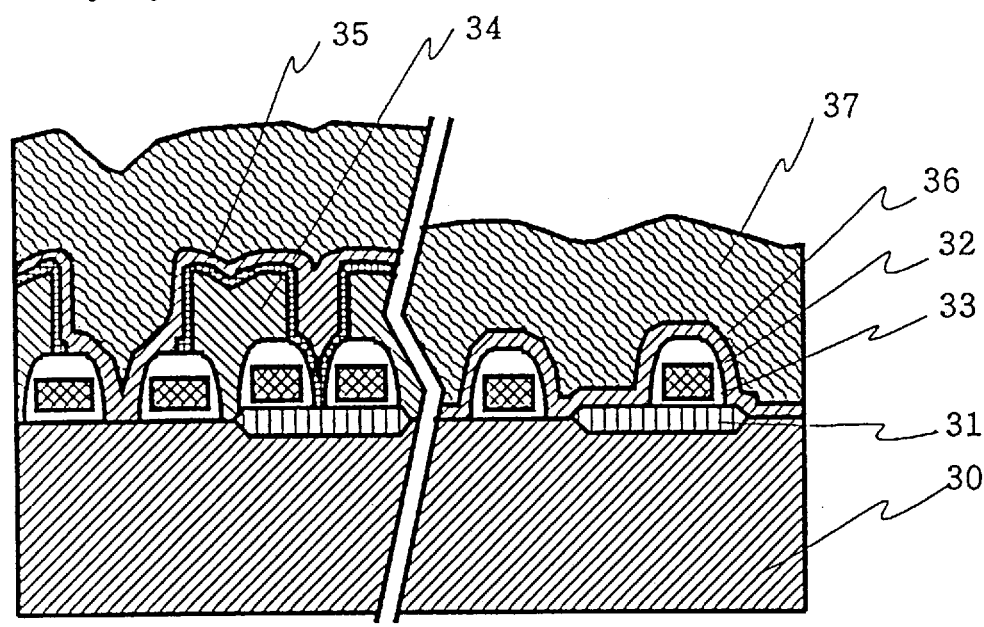
FIGS. 3(A) and 3(B) are views for explaining the process for planarizing the surface of a doped insulating film on the surface of a DRAM.
Figure 3B:
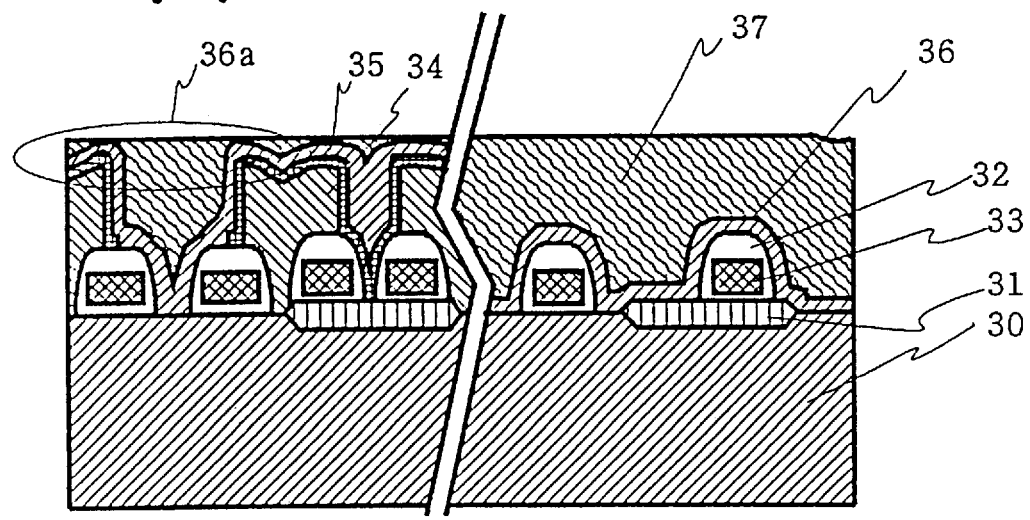
Figure 4A:
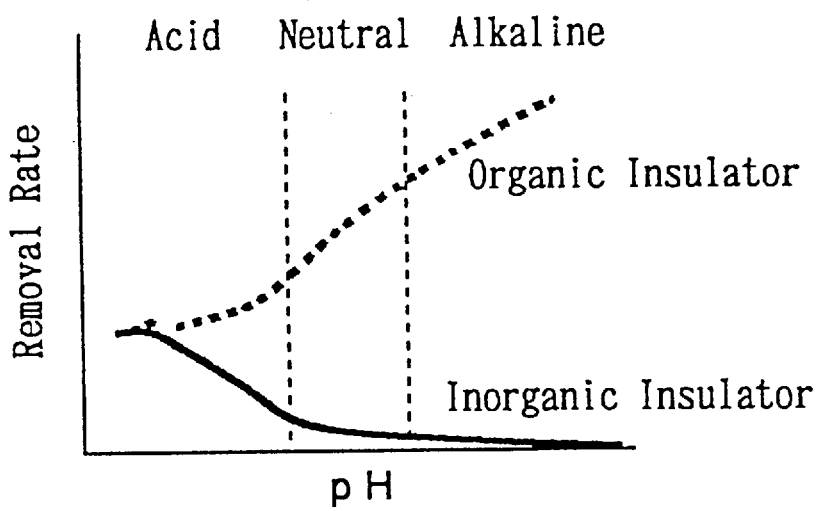
FIGS. 4(a) and 4(b) are diagrams showing the relation between the polishing rate of the ceria slurry, and the pH value.
Figure 4B:
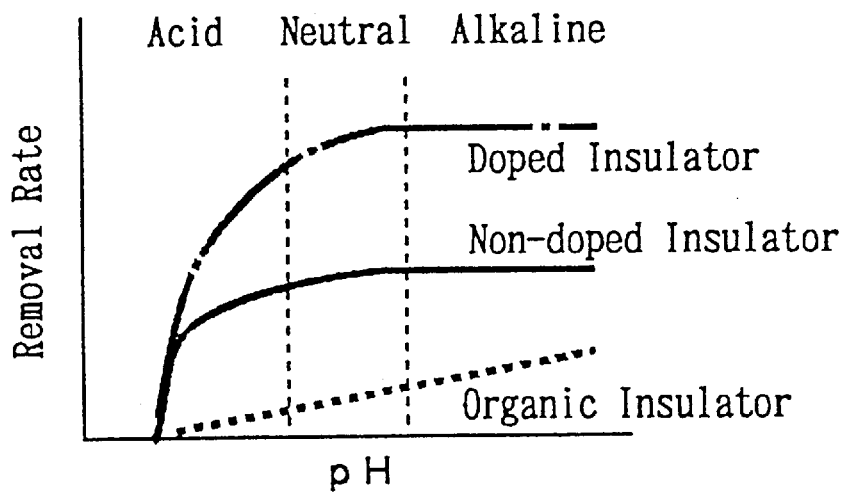

Example 3 of the present invention will be described with reference to FIGS. 3(A) and 3(B). FIG. 3(A) shows a cross section of the device of an integrated memory circuit (Dynamic Random Access Memory, hereinafter referred to as the "DRAM") requiring "refreshing" in the stage immediately before the metal electrodes of transistors are formed. Incidentally, the lefthand side shows the so-called "memory cell section" for storing memory information, and the righthand side schematically shows the transistor section of a peripheral circuit for driving the memory cells. In order to enhance the integration of a DRAM highly to 16 Mbits or more per chip, there has been generally used a structure called the "Stacked Capacitor Cell." As shown in FIG. 3(A), there are formed a gate 32 of the transistor, which is enclosed by a first insulating film 31 for isolating the elements on the surface of a wiring substrate 30 and a second insulating film 33 of $SiO_2$ formed by a CVD method, and first and second capacitor electrodes 34 and 35 for capacitance accumulation through an insulating film (not shown). These are covered with a third insulating film 36 of a nondoped insulating film having a thickness of 0.3 $\mu$m. Over this third insulating film 36, there is formed a fourth doped insulating film 37 containing 4% phosphorus and 10% boron and having a thickness of 1.5 $\mu$m. Due to the presence of the aforementioned capacitor electrodes, the surface of the fourth insulating film 37 of the memory cell section (lefthand half of FIG. 3(A)) is higher by 1.0 $\mu$m on an average than the peripheral circuit section (of the righthand half). Such a large step may be a cause of reduction of the processing accuracy at the lithography step and at the dry etching step. Then, the surface of the fourth insulating film 37 was polished by an alkaline ceria slurry using the cerium oxide B. The polishing condition was substantially identical to that of the foregoing Examples. Since the polishing rate of the $SiO_2$ film containing phosphorus and boron is higher by two times or more than that of the nondoped insulating film, it was easy to stop the polishing when both the third insulating film 36 below the fourth insulating film 37 of the memory cell portion and the bulging surface 36a were exposed. When using colloidal silica, however, the doped insulating film is polished at a high polishing rate, so that ratio of the removal rates of polishing using colloidal silica and the ceria slurry of the present invention are also about five.

After the polishing, the wiring substrate 30 was cleaned with 10% ammonium solution, and the substrate was subjected to the steps of forming via holes and forming metal electrodes of the transistors (neither of them is shown).

Since the height of the step between the memory cell section and the peripheral circuit section was decreased to 0.3 $\mu$m or less by the polishing, the processing accuracies of the lithography and dry etching were kept at sufficiently high levels. Incidentally, the Figures of the Example show the substrate in which the surface of the fourth insulating film 37 was smoothed by a heat treatment at a sufficiently high temperature (a description has been already made that the smoothing step is not essential for the present Example). This smoothing is realized generally at first by forming a doped insulating film containing phosphorus and boron by a CVD method at a substrate temperature of 350° to 400° C. and subsequent by performing a heat treatment at 850° to 900° C. to stabilize the phosphorus and to fluidize the film surface. In order to prevent the characteristics of the very fine transistor elements or the (not-shown), capacitor insulating film from being deteriorated, however, it is desired to lower the heat treatment temperature below 800° C. At a temperature below 850° C., phosphorus and boron in the doped insulating film 37 can be stabilized but smoothing the surface of the film 37 is difficult. Therefore one may believe that the technique requiring fluidization has come to its limit. However, phosphorus can be stabilized according to the present invention by subjecting the doped insulating film 37 to a heat treatment of 450° C. or higher. Without the surface smoothing step by the fluidization, therefore, according to the present invention planarizing with a residual step of 0.3 $\mu$m or less is realized by polishing.

After polishing, the wiring substrate 30 is dipped in a liquid containing an aqueous solution of 10% ammonium carbonate and a hydrogen peroxide solution at a ratio of 1:1. As a result, the ceria slurry is dissolved or removed from the wiring substrate 30, and the substrate is cleaned.

According to the present invention, a fragile inorganic or organic insulating film, which was prepared at a relatively low temperature, can be polished without causing any deterioration of the current characteristics of the semiconductor elements due to Na diffusion or the like.

What is claimed is:

1. A polishing method for polishing an insulating film of a silicon compound containing at least 1% by weight organic components on a substrate, the method comprising a step of chemically-mechanically polishing a surface of the insulating film with a slurry including cerium oxide particles, said particles having a crystallite size of not more than 30 nm.

2. A polishing method according to claim 1, wherein said slurry is alkaline.

3. A polishing method according to claim 2, wherein said polishing is selective polishing of the insulating film.

4. A polishing method according to claim 1, wherein said insulating film is a film containing 10% or more of organic components.

5. A polishing method according to claim 1, wherein said insulating film has a relative dielectric constant of not more than 3.5.

6. A polishing method according to claim 1, wherein a sodium concentration of said slurry is not more than 2 ppm.

7. A polishing method according to claim 1, wherein a combined concentration of sodium, calcium, iron and chromium in said slurry is less than 10 ppm.

8. A polishing method according to claim 1, wherein said particles have an average diameter of not more than 0.3 $\mu$m.

9. A polishing method according to claim 1, wherein a backing pad, in contact with a side of the substrate opposite a side of said substrate on which the insulating film is provided, supports said substrate.

10. A polishing method according to claim 1, wherein a concentration of cerium oxide particles in the slurry is at least 5%.

11. A polishing method according to claim 1, wherein the slurry contains the cerium oxide particles dispersed in water.

12. A polishing method according to claim 1, including a further step of dipping the chemically-mechanically polished substrate in a solution containing a material selected from the group consisting of sulfuric acid, nitric acid, ammonium carbonate and ammonia.

13. A polishing method according to claim 12, wherein the solution also includes hydrogen peroxide, and wherein the solution is at a temperature of at least 50° C. during the dipping step.

14. A polishing method according to claim 12, wherein ozone is bubbled through the solution, and the solution is at a temperature of at least 50° C., during the dipping step.

15. A polishing method according to claim 1, wherein said slurry has a pH of at least 7.5, whereby said slurry is alkaline; or wherein said slurry has a pH of at most 6.5, whereby said slurry is acidic.

16. A polishing method according to claim 15, wherein said slurry has a pH of at least 7.5.

17. A polishing method according to claim 16, wherein said slurry has a pH of at least 8.0.

18. A polishing method according to claim 15, wherein said slurry has a pH of at most 6.5.

19. A polishing method according to claim 12, wherein said solution contains a mixture of nitric acid and hydrogen peroxide.

20. A polishing method according to claim 12, wherein said solution contains a mixture of ammonium carbonate and hydrogen peroxide.

21. A polishing method comprising steps of:

forming an insulating film of a silicon compound containing at least 1% by weight organic components on a wiring substrate having an uneven main surface, and chemically-mechanically polishing a surface of said insulating film with a slurry including cerium oxide particles, the cerium oxide particles having a crystallite size of not more than 30 nm.

22. A method of selectively polishing a surface of a film of a silicon compound containing at least 1% by weight organic components on an inorganic layer, comprising a step of selectively chemically-mechanically polishing the surface of the film with a slurry including cerium oxide particles, the cerium oxide particles having a crystallite size of not more than 30 nm.

* * * * *